United States Patent [19]
Olsen et al.

[11] Patent Number: 6,091,166
[45] Date of Patent: Jul. 18, 2000

[54] DC SOLID STATE RELAY

[75] Inventors: Michael P. Olsen, Minneapolis; Larry P. Grovum, Brooklyn Park, both of Minn.

[73] Assignee: HLO, L.L.P., Eden Prairie, Minn.

[21] Appl. No.: 09/337,813

[22] Filed: Jun. 22, 1999

[51] Int. Cl.[7] .................................................. H01H 47/00
[52] U.S. Cl. ..................... 307/125; 315/291; 315/307; 327/446
[58] Field of Search .................................... 315/291, 307, 315/308, 312; 307/125; 327/446, 452, 455

[56] References Cited

U.S. PATENT DOCUMENTS

| | | | |
|---|---|---|---|
| 3,932,770 | 1/1976 | Fantozzi | 307/252 UA |
| 4,200,860 | 4/1980 | Fritzinger | 340/43 |
| 4,521,693 | 6/1985 | Johnson | 307/252 T |
| 4,896,828 | 1/1990 | Peitz, Jr. | 236/10 |
| 5,140,255 | 8/1992 | Tardio et al. | 323/322 |
| 5,327,123 | 7/1994 | Heimann et al. | 340/916 |
| 5,612,596 | 3/1997 | Wiese | 315/291 |
| 5,659,305 | 8/1997 | Rains et al. | 340/931 |
| 5,699,218 | 12/1997 | Kadah | 361/13 |
| 5,734,116 | 3/1998 | Schaeffer | 73/865.6 |

*Primary Examiner*—Josie Ballato
*Assistant Examiner*—Robert L. Deberadinis
*Attorney, Agent, or Firm*—Kinney & Lange, P.A.

[57] ABSTRACT

A semiconductor based relay is provided for selectively coupling differing periodic power sources to loads through semiconductor switches provided therein while selectively using the alternating polarity to constant polarity voltage converter outputs as switched in a separate circuit to also contribute to the operation of the relay circuitry in conjunction with selection signals.

15 Claims, 2 Drawing Sheets

DC SOLID STATE RELAY

BACKGROUND OF THE INVENTION

The present invention relates to solid state relays and, more particularly, to solid state relays used in traffic signal light control systems.

Intersecting vehicle thoroughfares often have provided at their intersections standards supporting vehicle traffic control signal lights with one light of each color on each standard visible across the intersection from each of the thoroughfares. These signal lights are typically operated under the control of a control system, including the timing controller and the conflict monitor, housed in a control system cabinet provided in the vicinity of the intersection. The control system and the signal lights are typically operated using alternating current obtained from a commercial electrical power distribution system.

The green, red and yellow signal lights usually used at an intersection, under the direction of the control system, are typically operated to be continuously switched on for selected short time intervals, or are otherwise operated in a switched on-switched off, or flashing, sequence over other selected time intervals. The control system accomplishes such operation of the signal lights through generating signals in the timing controller to close and open load switches that control the supply of alternating currents through a flash transfer relay to the signal lights in those situations in which the signal lights are to be continuously switched on during selected intervals. The flash transfer relay is placed in a first switching state by the conflict monitor during times including those selected intervals that enables the load switches to be effective in selecting those intervals for delivery of alternating current to the lights. In those intervals in which the signal lights are to flash, the conflict monitor directs this condition through the flash transfer relay by changing the relay to another, or second, switching state.

The flash transfer relays provided in typical traffic signal light control systems have traditionally been electromagnetic devices using the presence or the absence of current in a coil to create or end magnetic fields to open or close electrical contacts. These contacts, in the absence of contamination, or other electrical conductivity limiting effects, tend to have very small voltage drops thereacross during times they are closed and carrying substantial electrical currents therethrough. Thus, they dissipate relatively little electrical power during the carrying of substantial electrical currents therethrough. On the other hand, such contacts suffer from impact recoil so that they rapidly open and close following the first making contact in a switch closing thereby leading to "chattering", and there are discharges between the contacts as they come close to one another leading to "arcing" which causes corrosion and erosion of those contacts. Such contacts, of course, are already subject to contamination from external sources if they are not in a sealed enclosure. In addition, such behavior often leads to the generation of unwanted electrical noise in the circuits connected thereto and in circuits located nearby.

Because of these deficiencies in electromechanical relays, solid state relays have been developed as substitutes in some situations. Such relays use power semiconductor devices which can operate as switches to switch on and off relatively large currents, and can with stand relatively large voltages thereover when switched off. The use of such semiconductor device switches avoids the presence of any moving parts which can wear out, and avoids the use of contacts which are subject to erosion, corrosion and contamination, and thereby also avoids contact chattering and the undue generation of electrical noise. However, such power semiconductor switches do have a relatively large voltage drop thereacross even when switched on to conduct current therethrough and, thus, these devices are subject to significant electrical energy dissipation.

The use of a solid state relay for flash transfer relays in traffic signal light control systems of typical design is difficult because of the electrical signals available to operate the flash transfer relay. In typical control systems of the past, electromechanical relays were used which merely need to have an alternating current supply provided to the coil thereof whenever relay contacts therein are to be actuated, and removed therefrom when those relay contacts are to no longer be actuated. Thus, such a selectively provided alternating current supply serves as the operating signal for switching the flash transfer relay between switching states thereof.

In some typical traffic signal light control systems operating normally, such signal operation control alternating current is always supplied when the signal lights are to be switched on continuously over selected intervals, and this alternating current is removed when the signal lights are to flash (an "energized"system). Other typical signal light control systems are operated in the opposite manner with the signal operation control alternating current being supplied only during instances in which the signal lights are to be flashing, and otherwise not provided when the signal lights are to be switched continuously on over selected intervals (a "deenergized" system).

However, these traffic signal light control systems, if operated using constant polarity voltages, can have large portions thereof operated with voltages of smaller magnitudes to thereby reduce risks to those who install and maintain such systems. In addition, such systems operated in large part with constant polarity voltages allow the use of less costly components as well as permitting reduced electrical power consumption, and often facilitate the provision of further circuit features. Furthermore, transients and electrical noise are often reduced on the power supply interconnections by the use of an alternating polarity to constant polarity voltage converter to provide the constant polarity operating voltage for portions of the system. Finally, the increasing use of light-emitting diode arrays as traffic intersection signal lights has led to a desire to operate them using constant polarity voltages in the future, and so is also leading to a desire to operate the control systems therefor using the same kinds of voltages even now with alternating polarity voltage operating these signal lights. Thus, there is a desire to have a solid state relay for the control system flash transfer relay operated from a constant polarity electrical energy supply.

BRIEF SUMMARY OF THE INVENTION

The present invention provides a semiconductor based relay for selectively coupling differing periodic power sources to loads through semiconductor switches provided therein while selectively using the alternating polarity to constant polarity voltage converter outputs as switched in a separate circuit to also contribute to the operation of the relay circuitry in conjunction with selection signals. Such selection signals are provided by a control system which is typically a traffic signal light control system that provides these signals to operate controlled switches for use with the relay serving as a flash transfer relay therein, and with the loads being signal lights. In addition, further related switching in the relay can be provided to aid in ensuring that only automatic signal light operation or only flashing light operation occurs at any one time.

Suitable semiconductor switches are triacs activated by bilateral switches. Optical isolation between the bilateral switches and the rest of the relay switching controller is provided.

DETAILED DESCRIPTION

Figure 1:
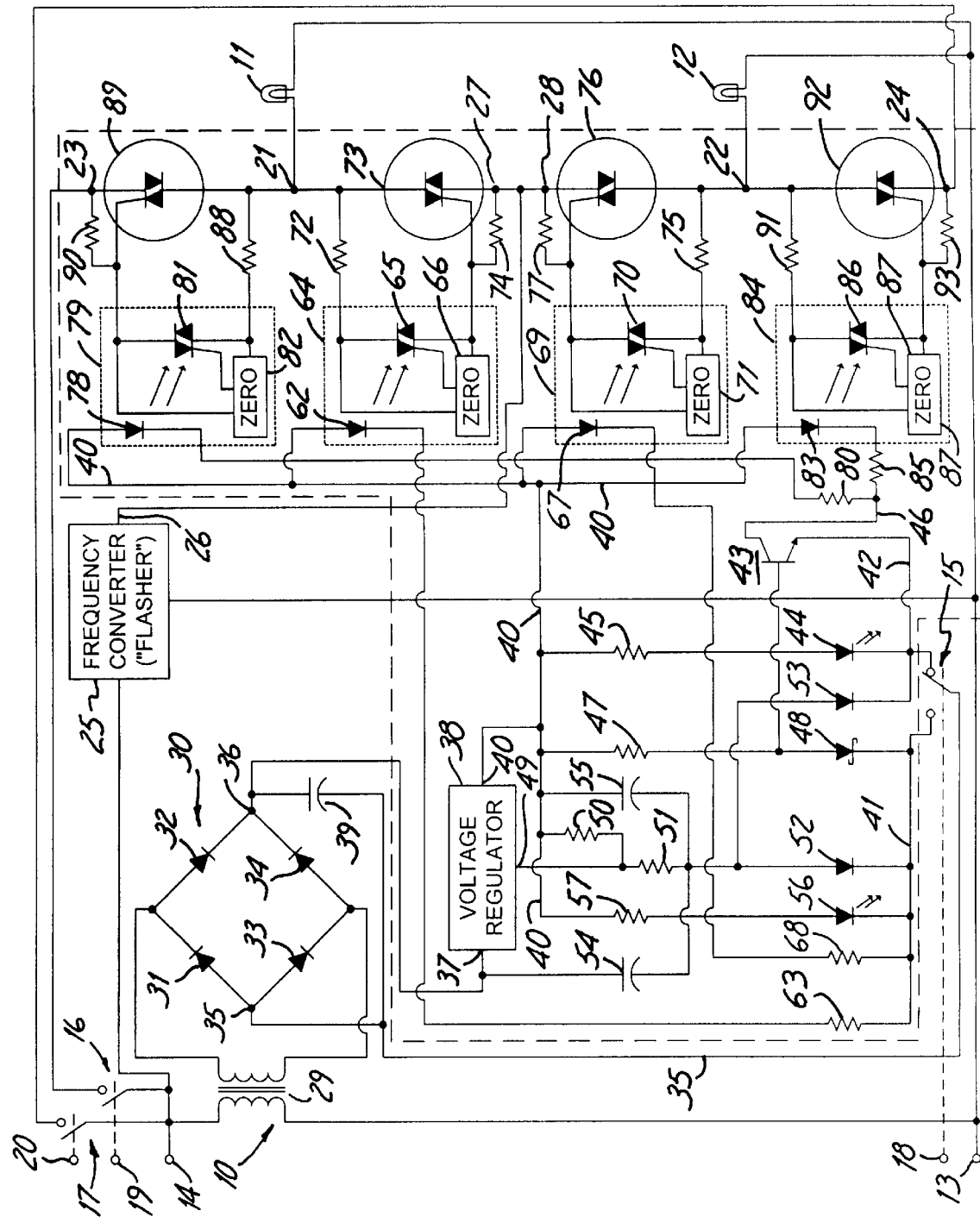
FIG. 1 shows an electrical schematic diagram of a circuit embodying the present invention.

FIG. 1 shows an electrical schematic diagram of a semiconductor device based, or solid state, relay, 10, within the dashed line enclosure, serving as a flash transfer relay in a traffic signal light control system (this control system being only partly shown in that figure) slightly modified to provided a source of constant polarity voltage from what is an otherwise typical design as used for conventional control systems offered in the commercial marketplace. Control signals to flash transfer relay 10 select the switching status, or state, of that relay so that the traffic signal lights, 11 and 12, controlled in part thereby are, in one switching state, enabled to be continuously on over time intervals selected by the timing controller load switches or, in another switching state, are operated in an on-off alternating sequence, i.e. "flashing" those lights. Control signal lights 11 and 12 may be, for instance, both red colored lights on a standard installed at an intersection, with one of them being observable by people in vehicles or by pedestrians traveling along one street or thoroughfare crossing that intersection. The remaining light would visible along the other street crossing that intersection.

The traffic signal light control system for these lights is typically supplied electrical energy from a commercial source providing voltages and currents therefrom in the form of single phase sinusoidal waveforms characterized by a selected frequency and amplitude, i.e. alternating currents. One typical commercial source provides an approximately constant amplitude voltage single phase sinusoidal waveform with a frequency of 60 Hz and an amplitude of about 115 volts rms. In the portion of the traffic signal light control system shown in FIG. 1, such an electrical energy source would have a neutral conductor correspondingly connected to a zero voltage reference terminal, 13, of relay 10 and a phase conductor correspondingly connected to a phase or "hot" terminal, 14.

Three switches, 15, 16 and 17, are provided in the other portions of the traffic signal lights control system outside of relay 10 with one side of each of single pole, single throw switches 16 and 17 connected to "hot" terminal 14. Single pole, double throw switch 15 has its pole connected to a constant polarity voltage source to be described below. These switches are schematically shown in FIG. 1. Switch 15 is provided to control operation of relay 10, and switches 16 and 17 are provided to control "continuously on" operation of lights 11 and 12 through power switches in relay 10 so as to have this control effectively enabled by relay 10.

Figure 2:
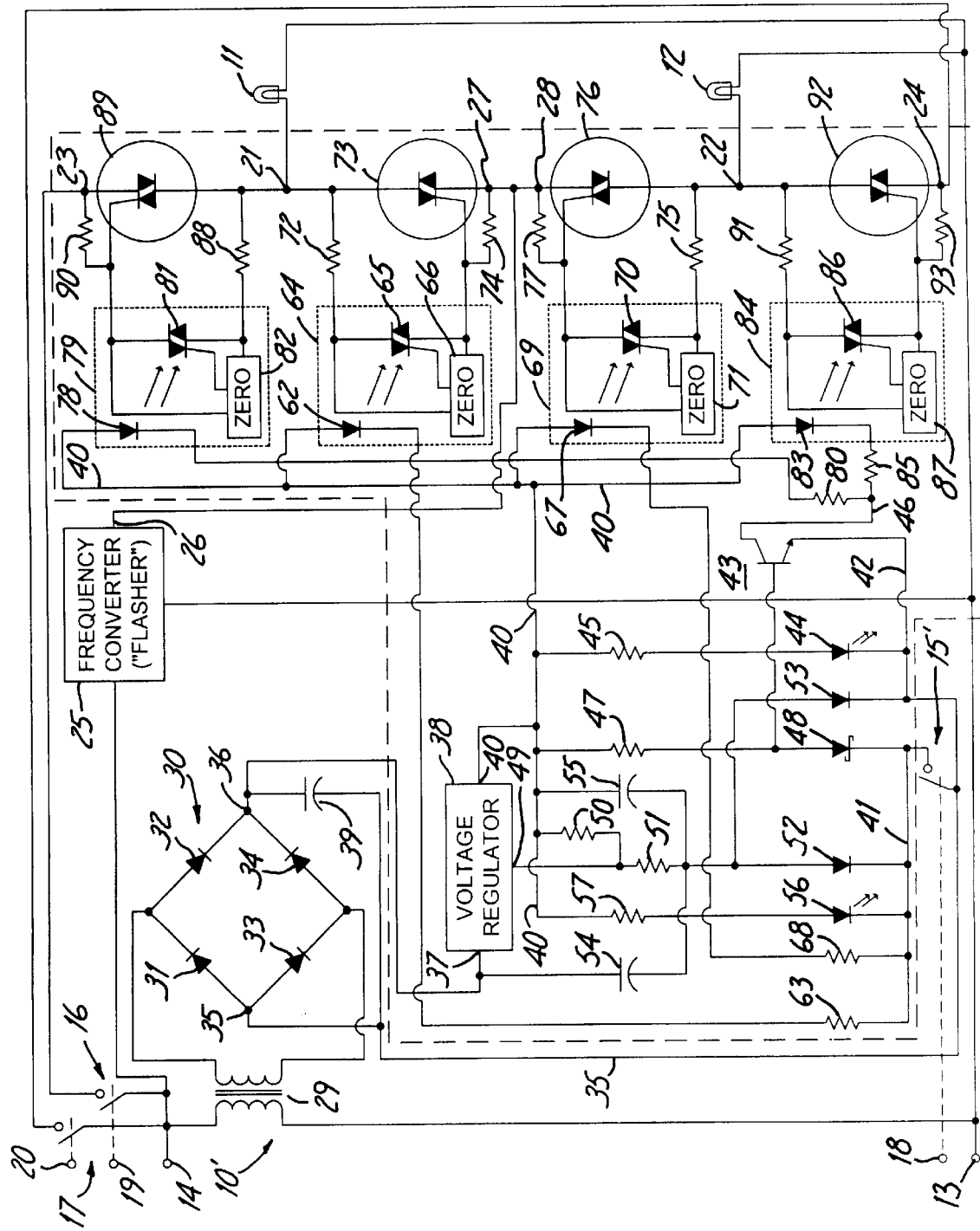
FIG. 2 shows an electrical schematic drawing of an alternative circuit embodying the present invention.

FIG. 2 shows an alternate electrical schematic diagram of a semiconductor device based, or solid state, relay ,10', which is the same as the relay electrical schematic diagram of FIG. 1 except as to the implementation of switch 15. In FIG. 2, a single pole, single throw, switch, 15', is used in place of switch 15 of FIG. 1, again having its pole connected to the constant polarity voltage source to be described below. Except for slight accommodations for the differences related to switches 15 and 15', the operation of the circuits of FIGS. 1 and 2 are the same.

Switch 15 is the "flash/automatic" switch which determines the switching state of relay 10, and so whether lights 11 and 12 are enabled to operate in a continuously on condition over selected time intervals or to operate in a flashing condition. The signal for opening and closing switch 15 is provided from the remaining portions of the control system on a terminal, 18, specifically, the conflict monitor.

Switches 16 and 17 are the "load switches" indicated above which are switched, in those situations in which lights 11 and 12 are to be operated continuously on or off over selected time intervals, to set just what the intervals are during which these off or continuously on light operations occur. A control signal from the remaining portions of the control system for controlling the opening and closing of switch 16 appears on a terminal, 19, and a control signal from the remaining portions of the control system for controlling the opening and closing of switch 17 appears on a further terminal, 20. Control signals on terminals 19 and 20 are specifically provided by the timing controller.

Thus, the control signals provided on terminals 19 and 20 from the remaining portions of the control system to open and close switches 16 and 17, respectively, determine if electrical energy is supplied from "hot" terminal 14 to lights 11 and 12 when permitted by the then current switching state of relay 10. Relay 10 enables any such supplying of electrical energy to lights 11 and 12 because switches 16 and 17 are connected to lights 11 and 12 only through relay 10. That is, lights 11 and 12 are electrically connected to a pair of relay power output terminals, 21 and 22, and switches 16 and 17 are electrically connected a pair of corresponding relay power input terminals, 23 and 24, respectively. Hence, switches 16 and 17, during those times they are switched on, provide electrical energy to lights 11 and 12 to keep them continuously lit only in those situations in which relay 10 is in a switching state in which power input terminal 23 is conductively connected to power output terminal 21 and power input terminal 24 is conductively connected to power output terminal 22 in relay 10. "Hot" terminal 14, in addition to being connected to switches 16 and 17, is also connected to a power frequency converter, 25, again located in other portions of the traffic signal light control system than is relay 10. Frequency converter 25, commonly referred to as a "flasher", is also connected to reference terminal 13. Flasher 25 provides and removes a sinusoidal waveform at an output thereof, 26, to serve as an electrical energy source for operating lights 11 and 12 during flashing operations having an average frequency less than that of the sinusoidal waveform frequency. This is accomplished by flasher output 26 being electrically connected to one of two further relay power input terminals, 27 and 28, shown electrically connected together in FIG. 1 so that flasher output 26 is connected to both. Flasher 25 continuously provides typically "on-off" periods of equal duration of a 60 Hz sinusoidal voltage waveform at output 26 thereof having an "on-off" frequency of just 1 Hz and again having an amplitude of about 115 volts rms during "on" periods.

The constant polarity voltage source mentioned above provided in the other portions of the traffic signal lights control system outside of relay 10 has a step-down transformer, 29, having its primary or input coil connected between "hot" terminal 14 and reference terminal 13. The secondary coil of transformer 29 has a number of turns relative to the primary coil to result in an output voltage with a magnitude that is acceptable for the input of the subsequent voltage regulator, such an output voltage typically being from 12 to 24 volts peak. The secondary coil of transformer 29 is connected across a full-wave bridge rectifier, 30, first at the junction of the cathode of a diode, 31, and the anode of another diode, 32. The remaining connection of this secondary coil is to the junction of the cathode of a diode, 33, and the anode of another diode, 34. The negative polarity voltage reference output, 35, of bridge rectifier 30 at the junction of the anodes of diodes 31 and 33 is provided to the pole of switch 15 in FIG. 1, as indicated above, and to the pole of switch 15' in FIG. 2 with also a further interconnection in that figure to be described below. The positive polarity voltage output, 36, of bridge rectifier 30 at the junction of the cathodes of diodes 32 and 34 is provided to an input thereof, 37, of a constant polarity voltage regulator, 38. A filtering capacitor, 39, is connected between the positive and negative polarity voltage outputs of bridge rectifier 30.

The output, 40, of voltage regulator 38 provides a regulated, constant polarity voltage of typically 3.1 V and forms an interconnection arrangement to supply this voltage for the operation of the remainder of relay 10. The return to negative polarity voltage reference output 35 from voltage regulator output 40 in FIG. 1 is, as indicated above, provided through the pole of switch 15 having its two switch terminals connected to a first selectable reference interconnection, 41, and a second selectable reference interconnection, 42. Thus, control signals on control input 18 cause the pole of switch 15 to be switched to one or the other of reference interconnections 41 and 42 to result in current being drawn either through circuit components connected between positive regulated voltage interconnection 40 and first selectable reference interconnection 41, or through circuit components connected between positive regulated voltage interconnection 40 and second selectable reference interconnection 42.

In the circuit of FIG. 2, the return to negative polarity voltage reference output 35 from voltage regulator output 40 in FIG. 1 is, as indicated above, provided through the pole of switch 15' having its switch terminal connected to selectable reference interconnection 41 as for switch 15 in FIG. 1, but is provided as a direct connection to what is now direct reference interconnection 42 in FIG. 2. As a result, control signals on control input 18 cause the pole of switch 15' to be switched open or connected to selectable reference interconnection 41 to prevent or permit current to be drawn though circuit components connected between positive regulated voltage interconnection 40 and selectable reference interconnection 41. When current is prevented from being drawn though circuit components connected between positive regulated voltage interconnection 40 and selectable reference interconnection 41 by switch 15' being open, current will be drawn though circuit components connected between positive regulated voltage interconnection 40 and direct reference interconnection 42 as will be described below.

A bipolar npn transistor, 43, is connected to second selectable reference interconnection 42 through having its emitter connected thereto. In addition, the cathode of an indicator light-emitting diode, 44, is connected to reference interconnection 42 that further has its anode connected through a resistor, 45, to interconnection 40. The collector of transistor 43 is connected to a derivative second selectable reference interconnection, 46, which is brought to within a saturation voltage drop of second selectable reference interconnection 42 when transistor 43 is switched strongly into the "on" condition.

Such an "on" condition occurs in the circuit of FIG. 1 when the pole of switch 15 is switched by control signals on control input 18 to connect with second selectable reference interconnection 42 because current is then drawn into the base of transistor 43 through a resistor, 47, that is connected between that base and interconnection 40. When, instead, the pole of switch 15 is switched by control signals on control input 18 to connect with first selectable reference interconnection 41, the current drawn through resistor 47 instead passes through a Schottky diode, 48, to alternatively reach interconnection 41. The emitter of transistor 43 is then an open circuit resulting in transistor 43 being in the "off" condition.

In the circuit of FIG. 2, such an "on" condition occurs when the pole of switch 15' is switched open by control signals on control input 18 so that current drawn through resistor 47 no longer passes through Schottky diode 48 to hold transistor 43 in the "off" condition in reaching selectable reference interconnection 41 as it does when switch 15' is closed. That current is instead drawn into the base of transistor 43 through resistor 47 to reach direct reference interconnection 42 thereby switching transistor 43 into the "on" condition.

Voltage regulator 38 has a voltage output value adjusting input, 49, to be used to select the desired output voltage value by selecting, as an output voltage feedback fraction, the ratio of the magnitudes of two resistors, 50 and 51, connected at the connection junction therebetween to that regulator input. These resistors must also be connected between output terminal 40 of regulator 38 and negative polarity voltage reference output 35 to provide the required feedback of the regulator output voltage. Thus, the other end of resistor 50 is connected to interconnection 40.

However, the other end of resistor 51 must be arranged to be connected to negative polarity voltage reference output 35 for regulator 38 to properly regulate no matter which position the pole of switch 15 takes, that is, no matter whether switched to first selectable reference interconnection 41 or to second selectable reference interconnection 42. Similarly in FIG. 2, the other end of resistor 51 must be arranged to be connected to negative polarity voltage reference output 35 for regulator 38 to properly regulate no matter which position the pole of switch 15' takes, that is, no matter whether switched to an open or closed position. Hence, this other end of resistor 51 is connected through an isolating diode, 52, to first selectable reference interconnection 41 and also through another isolating diode, 53, to second selectable reference interconnection 42 in FIG. 1. In the circuit of FIG. 2, this other end of resistor 51 is connected through isolating diode 52 to selectable reference interconnection 41 and also through isolating diode 53 to direct reference interconnection 42. Also in the circuits of both figures, a first filtering capacitor, 54, is connected between input 37 of regulator 38 and this other end of resistor 51. A second filtering capacitor, 55, is connected between output 40 of regulator 38 and this same other end of resistor 51.

In addition to transistor 43 being in the "on" condition when the pole of switch 15 in FIG. 1 is switched to second selectable reference interconnection 42, or the pole of switch 15' in FIG. 2 is switched to an open position, as described above, current in this situation is also drawn through light-emitting diode 44 and resistor 45 so that light is emitted therefrom. As will be described below, this position of the pole in switch 15, or of the pole in switch 15', occurs when the signal lights are being directed to be operated continuously over selected time periods set by load switches 16 and 17. Thus, the light emitted from diode 44 indicates that relay 10 is set for such operation. In the alternative situation in which the pole of switch 15 in FIG. 1 is switched to first selectable reference interconnection 41, or the pole of switch 15' in FIG. 2 is switched to a closed position, so that transistor 43 is in the "off" condition, as also described above, current is then drawn through a further light-emitting diode, 56, and a resistor, 57, connected in series therewith between positive regulated voltage interconnection 40 and reference interconnection 41 so that light is emitted therefrom. Again, as will be described below, this position of the pole in switch 15 in FIG. 1, or of the pole in switch 15' of FIG. 2, occurs when the signal lights are being directed to be operated continuously flashing so that the light emitted from diode 56 indicates that relay 10 is set for such operation.

The primary result, however, of currents drawn though circuit components connected between positive regulated voltage interconnection 40 and either first selectable reference interconnection 41 of FIG. 1 or selectable reference interconnection 41 of FIG. 2, or through circuit components connected between positive regulated voltage interconnection 40 and either second selectable reference interconnection 42 of FIG. 1 or direct reference interconnection 42 of FIG. 2, as set by control signals on control input 18 directing the switching of the pole of either of switches 15 or 15', is the establishment of circuit connections for signal lights 11 and 12. Such circuit connections establish whether these lights are operated continuously over selected time periods set by load switches 16 and 17 or are operated continuously flashing. In a so-called "energized" system type of traffic signal lights control system as shown in FIG. 1, switch 15 is switched to second selectable reference interconnection 42 in the absence of an energization signal provided for the control signals on terminal 18 to permit selectable continuous operation of lights 11 and 12, and switched to first selectable reference interconnection 41 to permit flashing operation of those lights in the presence of such an energization signal. In a "deenergized" system type of signal traffic lights control system as shown in FIG. 2, switch 15' is switched to an open position in the absence of an energization signal provided for the control signals on terminal 18 to permit selectable continuous operation of lights 11 and 12, and switched to connect to selectable reference interconnection 41 to permit flashing operation of those lights in the presence of such an energization signal.

Operation of signal lights 11 and 12 continuously flashing, set by having the pole of switch 15 switched to first selectable reference interconnection 41 in FIG. 1 or the pole of switch 15' to selectable reference interconnection 41 in FIG. 2, also results in placing transistor 43 in the "off" condition to thereby electrically isolate derivative second selectable reference interconnection 46 from second selectable reference interconnection 42 in FIG. 1 or direct reference interconnection 42 in FIG. 2. This results in completing two circuit paths between positive regulated voltage interconnection 40 and the corresponding reference interconnection 41. Transistor 43 is used in the circuit of FIG. 1 rather than a direct connection of the pole of switch 15 to derivative reference interconnection 46 so that a shorting failure in or about switch 15, leading to connecting both reference interconnections 41 and 42 to negative reference voltage output 35, leaves signal lights 11 and 12 in flashing operation. This follows in such a situation because of Schottky diode 48 holding transistor 43 in the "off" condition due to its forward voltage drop being less than the forward breakover voltage of the base-emitter junction of that transistor. Transistor 43 has a more primary role in the operation of the circuit of FIG. 2 in being directly relied upon as a switch in determining whether current from positive regulated voltage interconnection 40 will be drawn through selectable reference interconnection 41 or direct reference interconnection 42 because of the use of a single pole, single throw switch (switch 15') in "deenergized" systems.

In the first of these paths, interconnection 40 has the anode of a light-emitting diode, 62, connected thereto with the cathode of that diode connected through a current limiting resistor, 63, to first selectable reference interconnection 41. Light-emitting diode 62 is in a zero voltage crossing, bilateral switch output optoisolator, 64, (typical commercial part: Motorola, Inc. part MOC3063) in which there is also provided an optically activated silicon bilateral switch, 65, having incorporated therewith a zero-crossing control circuit, 66, (shown in block form only) to cause optically operated bilateral switch 65 to break down within a few volts of zero volts occurring across the main contacts thereof.

In the second of these paths between interconnection 40 and reference interconnection 41, there is a further light-emitting diode, 67, having its anode connected to interconnection 40 and its cathode connected through a further current limiting load resistor, 68, to interconnection 41. Light emitting diode 67 is part of a further zero voltage crossing, bilateral switch output optoisolator, 69, like optoisolator 64, and which also contains an optically activated silicon bilateral switch, 70, along with again a zero-crossing control circuit, 71, shown only in block form. Thus, by switching the pole of switch 15 to interconnection 41, current is drawn through light emitting diodes 62 and 67 along with their series load resistors to reach reference interconnection 41 and negative voltage reference 35 through switch 15. The current drawn through light-emitting diodes 62 and 67 is sufficient to cause them to emit light enough to switch on corresponding bilateral switches 65 and 70.

Bilateral switch 65 of optoisolator 64 is connected at a main terminal thereof in series with a current limiting resistor, 72, which resistor is connected at its opposite end to relay power output terminal 21, and to a main terminal of a triac, 73, (typical commercial part: Motorola, Inc. part MAC224A8). Bilateral switch 65 is connected at its other main terminal to the gate of triac 73. A further resistor, 74, is connected between the gate of triac 73 and power input terminal 27 to thereby be connected to the other main terminal of triac 73 which is electrically connected to relay power input 27. Resistor 74 shunts and supplies current to the gate of triac 73, depending on the polarity of the voltage between the main terminals of that triac, to thereby delay the switching of triac 73 into the "on" condition with either polarity of voltages applied across the main terminals thereof. A "snubber" circuit can be further supplied across these main terminals, as is well known, to control the increases of voltage across, and current through, triac 73.

Similarly, bilateral switch 70 of optoisolator 69 is connected at a main terminal thereof in series with a current limiting resistor, 75, which resistor is connected at its opposite end to relay power output terminal 22, and to a main terminal of a triac, 76. Bilateral switch 70 is connected at its other main terminal to the gate of triac 76. A further resistor, 77, is connected between the gate of triac 76 and power input terminal 28 to thereby be connected to the other main terminal of triac 76. Resistor 77 too shunts and supplies current to the gate of triac 76, depending on the polarity of the voltage between the main terminals of that triac, to thereby delay the switching of triac 76 into the "on" condition with either polarity of voltages applied thereacross. A "snubber" circuit can again be used with triac 76 if desired.

Operation of signal lights 11 and 12 continuously over selected time periods chosen through controlling the operation of load switches 16 and 17, set by having the pole of switch 15 in FIG. 1 switched to second selectable reference interconnection 42 or having the pole of switch 15' in FIG. 2 switched to direct reference interconnection 42, results in placing transistor 43 in the "on" condition to thereby bring derivative second selectable reference interconnection 46 within a saturation voltage drop of interconnection 42. This results in completing two further circuit paths which, in this instance, extend between positive regulated voltage interconnection 40 and derivative reference interconnection 46 and then to negative voltage reference output 35 through the pole of switch 15 in FIG. 1 or the direct connection output 35 in FIG. 2.

In the first of these further paths, a light-emitting diode, 78, in a zero voltage crossing, bilateral switch output optoisolator, 79, like optoisolator 64, with diode 78 having its anode electrically connected to interconnection 40 and its cathode electrically connected to a current limiting resistor, 80, that has its other end connected to derivative reference terminal 46. Optoisolator 79 also contains an optically activated silicon bilateral switch, 81, along again with a zero-crossing control circuit, 82, shown only in block form.

In the other of these further paths, a light-emitting diode, 83, in a zero voltage crossing, bilateral switch output optoisolator, 84, like optoisolator 64, with diode 83 having its anode electrically connected to interconnection 40 and its cathode electrically connected to a current limiting resistor, 85, that has its other end connected to derivative reference terminal 46. Optoisolator 84 also contains an optically activated silicon bilateral switch, 86, along again with a zero-crossing control circuit, 87, once more shown only in block form.

Bilateral switch 81 of optoisolator 79 is connected at a main terminal thereof in series with a current limiting resistor, 88, which resistor is connected at its opposite end to relay power output terminal 21, and to a main terminal of a triac, 89. Bilateral switch 81 is connected at its other main terminal to the gate of triac 89. A further resistor, 90, is connected between the gate of triac 89 and power input terminal 23 to thereby be connected to the other main terminal of triac 89 which is electrically connected to relay power input 23. Resistor 90 shunts and supplies current to the gate of triac 89, depending on the polarity of the voltage between the main terminals of that triac, to thereby delay the switching of triac 89 into the "on" condition with either polarity of voltages applied across the main terminals thereof.

Similarly, bilateral switch 86 of optoisolator 84 is connected at a main terminal thereof in series with a current limiting resistor, 91, which resistor is connected at its opposite end to relay power output terminal 22, and to a main terminal of a triac, 92. Bilateral switch 86 is connected at its other main terminal to the gate of triac 92. A further resistor, 93, is connected between the gate of triac 92 and power input terminal 24 to thereby be connected to the other main terminal of triac 92. Resistor 93 similarly shunts and supplies current to the gate of triac 92, depending on the polarity of the voltage between the main terminals of that triac, to thereby delay the switching of triac 92 into the on condition with either polarity of voltages applied thereacross. "Snubber" circuits can also be used with triacs 89 and 92 as desired.

If the pole of switch 15 in FIG. 1 is not switched to second selectable reference interconnection 42 or the pole of switch 15' in FIG. 2 is not open, but is instead switched to first selectable reference interconnection 41 in FIG. 1 or to selectable reference interconnection 41 in FIG. 2, no current is drawn through light-emitting diodes 78 and 83 so that bilateral switches 79 and 86 can not break over in the presence of any voltages provided thereto on relay power inputs 23 and 24 through load switches 16 and 17, respectively, to thus leave triacs 89 and 92 in the "off" condition. Of course, current will then be drawn through light-emitting diodes 62 and 67 so that bilateral switches 65 and 70 can break over in the presence of any voltages provided thereto on relay power inputs 27 and 28 by flasher 25. This will result in providing currents to and from the gates of triacs 73 and 76 depending on the polarity of that voltage to switch on triacs 73 and 76 in each polarity segment of the voltage supplied thereto on relay power input terminals 27 and 28.

Switching switch 15 in FIG. 1 to connect to second selectable reference interconnection 42, or opening switch 15' in FIG. 2, results in current being drawn through light-emitting diodes 78 and 83 allowing any output voltages provided through load switches 16 and 17 on relay power inputs 23 and 24 to break over bilateral switches 81 and 86, respectively, so as to provide currents to and from the gates of triacs 89 and 92 depending on the polarity of that voltage. Any such currents, resulting from the closure of load switches 16 and 17, switch on triacs 89 and 92 in each polarity segment of the voltage supplied thereto on relay power input terminals 23 and 24 through load switches 16 and 17. No current is drawn through light-emitting diodes 62 and 67 so that bilateral switches 65 and 70 can not break over in the presence of any voltages provided thereto on relay power inputs 27 and 28 to thus leave triacs 73 and 76 in the "off" condition.

Although the present invention has been described with reference to preferred embodiments, workers skilled in the art will recognize that changes may be made in form and detail without departing from the spirit and scope of the invention.

What is claimed is:

1. A semiconductor device based relay for controlling from a relay control input which of relay first and second power inputs are electrically connected therethrough to a relay first power output, said relay first power output being suited for selective coupling to a corresponding one of first and second periodical electrical energization sources, and said first and second relay power inputs being suited for selective coupling to a corresponding one of said first and second periodical electrical energization sources, said relay comprising:

first and second semiconductor switches each having first and second power terminating regions and a control input by which said semiconductor switch is capable of being directed to provide a conductive path between said first and second terminating regions thereof, said first and second semiconductor switches first terminating regions each being electrically connected to said first relay power output, said first semiconductor switch second terminating region being electrically connected to said relay first power input and said second semiconductor switch second terminating region being electrically connected to said relay second power input;

a operation converter having a pair of outputs, and having a pair of inputs suited for electrical connection to a pair of outputs of said first periodic electrical energization source, said operation converter providing a constant polarity operational electrical energy between said pair of outputs thereof in response to said operation converter being electrically energized at said inputs thereof from said first periodic electrical energization source;

an input selection switch having at least one terminating region, a common region, and a control input by which said input selection switch is capable of being directed to provide a conductive path between said common region thereof and a said terminating region thereof, said input selection switch common region being coupled to an initial one of said first operation converter pair of outputs, said input selection switch control input being coupled to said relay control input; and a switching controller having first, second and third constant polarity electrical energization inputs with first and second constant polarity electrical energization inputs each being coupled to one of said input selection switch first and second terminating regions and said initial one of said first operation converter pair of outputs, and with said third constant polarity electrical energization input being coupled to that one of said pair of control converter outputs other than said initial one thereof, and said switching controller further having first and second outputs each coupled to a corresponding one of said first and second semiconductor switches control inputs, said switching controller for providing a switching signal to just one of said first and second outputs thereof in response to a signal on said relay control input directing said input selection switch to provide a conductive path between said common region thereof and said terminating region thereof, and of providing such a said switching signal on just that remaining one of said first and second outputs thereof in response to a signal on said relay control input directing said input selection switch to eliminate any conductive path between said common region thereof and said terminating region thereof.

2. The apparatus of claim 1 wherein said operation converter further comprises a magnitude regulator for providing a constant polarity operational electrical energy between said pair of outputs thereof of a substantially constant magnitude.

3. The apparatus of claim 1 wherein said relay is provided in a traffic signal light control system and said first periodic electrical energization source is selectively provided to a corresponding one of said first and second relay power inputs through a load switch in said control system operated by remaining portions of said control system to select when said first periodic electrical energization source is to be coupled thereto.

4. The apparatus of claim 3 wherein said first and second periodical electrical energization sources differ in frequency.

5. The apparatus of claim 1 wherein said relay is provided in a traffic signal light control system and said second periodic electrical energization source is provided to a corresponding one of said fist and second relay power inputs.

6. The apparatus of claim 5 wherein said first and second periodical electrical energization sources differ in frequency.

7. The apparatus of claim 1 wherein each of said first and second semiconductor switches comprises a triac having first and second main terminals serving as said first and second power terminating regions thereof and a gate terminal with an optically activated bilateral switch coupled between said gate terminal and a corresponding one of said first and second main terminals, and with said control input being provided by a light-emitting diode optically coupled to said bilateral switch.

8. The apparatus of claim 7 wherein said relay is provided in a traffic signal light control system and a signal light is coupled to said first relay power output.

9. The apparatus of claim 1 further comprising third and fourth semiconductor switches each having first and second power terminating regions and a control input by which said semiconductor switch is capable of being directed to provide a conductive path between said first and second terminating regions thereof, said third and fourth semiconductor switches first terminating regions each being electrically connected to a relay second power output suited for selective coupling to a corresponding one of said first and second periodical electrical energization sources, said third semiconductor switch second terminating region being electrically connected to a relay third power input and said fourth semiconductor switch second terminating region being electrically connected to a relay fourth power input, said relay third and fourth power inputs being suited for selective coupling to a corresponding one of said first and second periodical electrical energization sources, said switching controller first and second outputs each coupled to a corresponding one of said third and fourth semiconductor switches control inputs.

10. The apparatus of claim 9 wherein each of said third and fourth semiconductor switches comprises a triac having first and second main terminals serving as said first and second power terminating regions thereof and a gate terminal with an optically activated bilateral switch coupled between said gate terminal and a corresponding one of said first and second main terminals, and with said control input being provided by a light-emitting diode optically coupled to said bilateral switch, said relay being provided in a traffic signal light control system with a first signal light coupled to said first relay power output and with a second signal light coupled to said second relay power output.

11. The apparatus of claim 1 further comprising a common actuation switch having first and second terminating regions and a control input by which said common actuation switch is capable of being directed to provide a conductive path between said first and second terminating regions thereof, said common actuation switch control input being coupled to said initial one of said first operation converter pair of outputs, said common actuation switch first terminating region being coupled to one of said input selection switch terminating region and said initial one of said first operation converter pair of outputs, and said common actuation switch second terminating region being coupled to one of said switching controller first and second outputs.

12. The apparatus of claim 11 wherein said operation converter further comprises a magnitude regulator for providing a constant polarity operational electrical energy between said pair of outputs thereof of a substantially constant magnitude.

13. The apparatus of claim 1 wherein said input selection switch further comprises first and second terminating region, a common region, and a control input by which said input selection switch is capable of being directed to provide a conductive path between said common region thereof and either of said first and second terminating regions thereof, and wherein said switching controller provides a switching signal to just one of said first and second outputs thereof in response to a signal on said relay control input directing said input selection switch to provide a conductive path between said common region thereof and said first terminating region thereof, and of providing such a said switching signal on just that remaining one of said first and second outputs thereof in response to a signal on said relay control input directing said input selection switch to provide a conductive path between said common region thereof and said second terminating region thereof.

14. The apparatus of claim 13 further comprising a common actuation switch having first and second terminating regions and a control input by which said common actuation switch is capable of being directed to provide a conductive path between said first and second terminating regions thereof, said common actuation switch control input being coupled to said initial one of said first operation converter pair of outputs, said common actuation switch first terminating region being coupled to one of said input selection switch first and second terminating regions, and said common actuation switch second terminating region being coupled to one of said switching controller first and second outputs.

15. The apparatus of claim 13 wherein said operation converter further comprises a magnitude regulator for providing a constant polarity operational electrical energy between said pair of outputs thereof of a substantially constant magnitude.

* * * * *